United States Patent
Hankui

(10) Patent No.: US 8,379,408 B2
(45) Date of Patent: Feb. 19, 2013

(54) ELECTROMAGNETIC SHIELD STRUCTURE, WIRELESS DEVICE USING THE STRUCTURE, AND METHOD OF MANUFACTURING ELECTROMAGNETIC SHIELD

(75) Inventor: Eiji Hankui, Tokyo (JP)

(73) Assignee: NEC Corporation, Tokyo (JP)

( * ) Notice: Subject to any disclaimer, the term of this patent is extended or adjusted under 35 U.S.C. 154(b) by 284 days.

(21) Appl. No.: 12/866,224

(22) PCT Filed: Dec. 9, 2008

(86) PCT No.: PCT/JP2008/072341
§ 371 (c)(1),
(2), (4) Date: Aug. 4, 2010

(87) PCT Pub. No.: WO2009/107303
PCT Pub. Date: Sep. 3, 2009

(65) Prior Publication Data
US 2011/0044019 A1  Feb. 24, 2011

(30) Foreign Application Priority Data
Feb. 28, 2008  (JP) .................................. 2008-048888

(51) Int. Cl.
*H05K 9/00* (2006.01)
(52) U.S. Cl. ......................................................... 361/818
(58) Field of Classification Search ................... 361/816, 361/818, 821, 763
See application file for complete search history.

(56) References Cited

U.S. PATENT DOCUMENTS

| 4,385,256 | A | * | 5/1983 | Tokita et al. | 313/407 |
| 4,446,372 | A | * | 5/1984 | Gurnee | 250/334 |
| 5,206,783 | A | * | 4/1993 | Mori et al. | 361/212 |
| 5,206,796 | A | * | 4/1993 | Thompson et al. | 361/818 |
| 5,500,789 | A | * | 3/1996 | Miller et al. | 361/816 |
| 6,137,691 | A | * | 10/2000 | Jang | 361/784 |
| 6,263,193 | B1 | * | 7/2001 | Iseki et al. | 455/84 |
| 6,570,086 | B1 | * | 5/2003 | Shimoji et al. | 174/377 |

(Continued)

FOREIGN PATENT DOCUMENTS
| JP | 8-204377 A | 8/1996 |
| JP | 9-266394 A | 10/1997 |

(Continued)

OTHER PUBLICATIONS

International Search Report for PCT/JP2008/072341 mailed Mar. 17, 2009.

*Primary Examiner* — Lisa Lea Edmonds
*Assistant Examiner* — Xanthia C Cunningham

(57) ABSTRACT

Provided are an electromagnetic shield structure capable of reducing the contamination of electromagnetic noise which is radiated from a digital device into a wireless device, and a wireless apparatus using the electromagnetic shield structure. This structure has a shield function to reduce the influence of the noise radiated from an LSI (102), by a first shield (3) and a second shield (4). An open face (4g) of a first L-shaped structure portion (4a) and an open face (4h) of a second L-shaped structure portion (4b) are opposed to each other. Accordingly, even if the first L-shaped structure portion (4a) and the second L-shaped structure portion (4b) are excited by the LSI (102), the electromagnetic fields radiated from the open faces (4g and 4h) cancel each other out to reduce the radiation of noise from the first L-shaped structure portion (4a) and the second L-shaped structure portion (4b).

20 Claims, 7 Drawing Sheets

U.S. PATENT DOCUMENTS

| | | | |
|---|---|---|---|
| 6,670,926 B2 * | 12/2003 | Miyasaka | 343/702 |
| 6,888,235 B2 * | 5/2005 | Lopata et al. | 257/691 |
| 7,177,161 B2 * | 2/2007 | Shima | 361/816 |
| 7,639,513 B2 * | 12/2009 | Otsuki | 361/818 |
| 8,061,012 B2 * | 11/2011 | Carey et al. | 29/592 |
| 8,112,130 B2 * | 2/2012 | Mittleman et al. | 455/575.1 |
| 2002/0175797 A1 * | 11/2002 | Black | 336/182 |
| 2003/0142485 A1 * | 7/2003 | Szu | 361/816 |
| 2004/0080917 A1 * | 4/2004 | Steddom et al. | 361/748 |
| 2005/0168961 A1 * | 8/2005 | Ono et al. | 361/784 |
| 2005/0266872 A1 * | 12/2005 | MacIntosh et al. | 455/550.1 |
| 2006/0067070 A1 * | 3/2006 | Otsuki | 361/816 |
| 2006/0293091 A1 * | 12/2006 | Hawker et al. | 455/575.1 |
| 2007/0211445 A1 * | 9/2007 | Robinson et al. | 361/818 |
| 2007/0238495 A1 * | 10/2007 | Hawker et al. | 455/575.5 |
| 2008/0043413 A1 * | 2/2008 | Okuda | 361/681 |
| 2008/0130259 A1 * | 6/2008 | Hederoth | 361/816 |
| 2008/0291654 A1 * | 11/2008 | Liao et al. | 361/818 |
| 2009/0069061 A1 * | 3/2009 | Laurent et al. | 455/575.7 |
| 2009/0093286 A1 * | 4/2009 | Zhu et al. | 455/575.5 |
| 2009/0147494 A1 * | 6/2009 | Iida et al. | 361/818 |
| 2009/0175013 A1 * | 7/2009 | Hamilton et al. | 361/767 |
| 2009/0231218 A1 * | 9/2009 | Brunks et al. | 343/705 |
| 2009/0244876 A1 * | 10/2009 | Li et al. | 361/818 |
| 2010/0008056 A1 * | 1/2010 | Ono et al. | 361/784 |
| 2010/0039749 A1 * | 2/2010 | Ritter et al. | 361/301.4 |
| 2010/0039787 A1 * | 2/2010 | Horng | 361/818 |

FOREIGN PATENT DOCUMENTS

| | | |
|---|---|---|
| JP | 10-126168 A | 5/1998 |
| JP | 2000059063 A | 2/2000 |
| JP | 2000341029 A | 12/2000 |
| JP | 3738755 B | 1/2006 |

* cited by examiner

ELECTROMAGNETIC SHIELD STRUCTURE, WIRELESS DEVICE USING THE STRUCTURE, AND METHOD OF MANUFACTURING ELECTROMAGNETIC SHIELD

This application is the National Phase of PCT/JP2008/072341, filed Dec. 9, 2008, which is based upon and claims the benefit of priority from Japanese patent application No. 2008-048888, filed on Feb. 28, 2008, the disclosure of which is incorporated herein in its entirety by reference.

TECHNICAL FIELD

The present invention relates to an electromagnetic shield structure which is implemented on a digital device, such as a large scale integration (hereinafter referred to as "LSI") or a module, in an instrument using wireless communication, such as a mobile phone, and to a wireless apparatus using the structure.

BACKGROUND ART

An electromagnetic wave caused by a high-frequency component of a digital clock signal is radiated from a digital device such as an LSI into a space and may have an influence on surrounding electronic devices. Especially, in an electronic device in which a digital circuit and an analog circuit (or a wireless circuit) are mounted, electromagnetic noise may be radiated and have an influence on the signal quality of a receiving antenna when an electromagnetic wave that corresponds with a wireless frequency of the electromagnetic wave radiated from the LSI that is the digital circuit flows into the wireless device. Therefore, a technique for reducing the electromagnetic noise radiated from the LSI is important for the wireless device in which the digital circuit and the analog circuit are mounted, to maintain the signal quality.

A power source decoupling technique is known as the technique for reducing the electromagnetic noise radiated from the LSI. An example of the technique is shown in FIG. 7.

In FIG. 7, a power source decoupling structure 100 is a structure for reducing electromagnetic noise radiated from a power source terminal 103 of an LSI 102 implemented on a substrate 101. The power source decoupling structure 100 is configured such that a capacitor 104 for decoupling is connected to the power source terminal 103 of the LSI 102 and a ground terminal 105. The ground terminal 105 provided on the surface of the substrate 101 is electrically connected to a ground layer 107 provided in the substrate 101, through a via hole 106 extending in the thickness direction of the substrate 101.

Because influential electromagnetic noise is usually high-frequency wave, the high-frequency electromagnetic noise radiated from a power source system of the LSI 102 flows into the ground terminal 105 provided on the surface of the substrate 101, the via hole 106 formed in the substrate 101, and the ground layer 107 in order by using the capacitor 104. As a result, it is possible to prevent the noise from leaking to other areas.

By the way, an electromagnetic shield technique is also used as the technique for reducing the electromagnetic noise radiated from the LSI. The electromagnetic shield technique is basically such that a metal cap covers the whole LSI and is connected to the ground of the substrate. An example thereof is shown in FIG. 6. In FIG. 6, the same symbols shown in FIG. 7 denote the parts corresponding to the elements of FIG. 7.

FIG. 6A shows an example of a typical metal shield structure 200. The metal shield structure 200 is provided on the substrate 101 and includes a metal shield 201. The shield 201, as shown in FIG. 6B, is configured by a top panel 202 that is larger than the LSI 102 implemented on the substrate 101 and four side panels 203 that are respectively provided along four sides of the top panel 202 and cover the four side surfaces of the LSI 102. The substrate 101, though not shown, has a multilayer structure, and as shown in FIG. 6C, the ground layer 107 is formed at an internal layer of the substrate 101. A plurality of via holes 204 extending in the thickness direction of the substrate 101 are formed in the substrate 101. These via holes 204 are arranged in a wall shape and at a narrow pitch along the side panels 203 of the shield 201. The shield 201 is electrically connected (grounded) to the ground layer 107 through the via holes 204.

Therefore, the LSI 102, as shown in FIG. 6C, is sandwiched between the top panel 202 of the shield 201 and the ground layer 107 formed in the substrate 101 at the top surface and the under surface of the LSI 102. The side surfaces of the LSI 102 are surrounded by the side panels 203 of the shield 201 and the wall of the via holes 204 (the via holes 204 arranged in a wall shape). Thus, the perimeter of the LSI 102 is surrounded by the conductor plates (metal plates) in the metal shield structure 200. Therefore, the electromagnetic noise radiated from the LSI 102 is shielded. As a result, the amount of noise radiated circumferentially by the LSI 102 decreases. That is, it is possible to reduce the electromagnetic noise radiated from the LSI 102.

However, in the metal shield structure 200, the LSI 102 is covered by the metal cap. Therefore, there is a drawback that the radiation efficiency of heat generated by the LSI 102 decreases. For this reason, a shield structure that is configured such that a pair of side panels 203 arranged at two facing side surfaces of the shield 201 is removed to release heat therefrom is proposed in Japanese Patent No. 3738755. This shield structure is supposed to be effective for decreasing the Electro-Magnetic Interference (EMI) generated by the LSI itself.

[Patent Document 1] Japanese Patent No. 3738755

DISCLOSURE OF INVENTION

Technical Problem

However, the metal shield structure 200 shown in FIG. 6 and the shield structure described in Japanese Patent No. 3738755 only reduce the radiation of the electromagnetic noise from the LSI. That is, these shield structures are merely intended to reduce the electromagnetic noise radiated from an LSI itself, but are not intended for a configuration in which a wireless device such as an antenna that receives the electromagnetic noise is also implemented. In other words, these structures are not intended for a configuration in which an element that receives the electromagnetic noise such as an antenna in addition to the radiation source of the electromagnetic noise such as an LSI are implemented on the substrate. Therefore, the electromagnetic shield structure that is effective in the wireless device that includes a digital circuit (digital device) as well as an analog circuit (analog device) mounted therein is needed.

The present invention has an object to provide an electromagnetic shield structure that can reduce the contamination of the electromagnetic noise that is radiated from the digital device and flows into the wireless device, and a wireless apparatus using the structure.

The present invention has another object to provide an electromagnetic shield structure that has a power source decoupling function of the digital device in addition to the electromagnetic shield function, and a wireless apparatus using the structure.

The other objects of the present invention which are not described here will be apparent from the following descriptions and accompanying drawings.

Technical Solution (1) A first exemplary aspect of the present invention is an electromagnetic shield structure including: a first shield and a second shield that are arranged on a substrate so as to cover a digital device that is implemented on the substrate, wherein the first shield is formed of a conductor electrically connected to a ground terminal of the substrate and is arranged on an outermost side of the electromagnetic shield structure, the second shield has a first structure portion being conductive and a second structure portion being conductive, each of the first structure portion and the second structure portion being separately formed and electrically connected to power source terminals of the substrate, the first structure portion and the second structure portion are arranged in such a way that open faces each formed at one end of the first structure portion and the second structure portion are opposed to each other with a predetermined gap, and the digital device is interposed between the first structure portion and the second structure portion and is covered by the first structure portion and the second structure portion.

In the electromagnetic shield structure according to the first exemplary aspect of the present invention, because the digital device that is the radiation source of the electromagnetic noise is covered by the first shield and the second shield, as mentioned above, the electromagnetic noise radiated from the digital device can be shielded. Therefore, it is possible to reduce the contamination of the electromagnetic noise that flows into the wireless device.

Further, even if the first structure portion and the second structure portion of the second shield are excited by the digital device, it is possible to reduce the radiation of the electromagnetic noise from the first structure portion and the second structure portion, because the open faces each formed at one end of the first structure portion and the second structure portion are opposed to each other and electromagnetic field radiated from the open faces is canceled. Thus, it is possible to effectively reduce the contamination of the electromagnetic noise that is radiated from the digital device and flows into the wireless device.

(2) In a preferable example of the electromagnetic shield structure according to the first aspect of the present invention, the first shield has a U-shaped cross section and is formed of a top panel having a size to cover the digital device, a first side panel that is arranged at one side of the top panel, and a second side panel that is arranged at another side that faces with the one side of the top panel.

(3) In further another preferable example of the electromagnetic shield structure according to the first aspect of the present invention, each of the first structure portion and the second structure portion of the second shield has an L-shaped cross section and is formed of a top panel that covers the digital device and a side panel that is bent and connected to one side of the top panel.

(4) In further another preferable example of the electromagnetic shield structure according to the first aspect of the present invention, a dielectric material is provided between the top panel of the first shield and the top panel of the second shield. In this example, because a capacitor is formed of the first shield, the second shield, and the dielectric material, the power source decoupling function of the digital device is achieved in addition to the electromagnetic shield function.

(5) In further another preferable example of the electromagnetic shield structure according to the first aspect of the present invention, the first shield and the second shield are arranged in such a way that the side panel of the first shield and the side panel of the second shield are perpendicular to each other or are parallel to each other.

(6) In further another preferable example of the electromagnetic shield structure according to the first aspect of the present invention, the top panel of the first structure portion and the top panel of the second structure portion in the second shield are not equal in length to about a quarter ($\lambda/4$) of a wavelength $\lambda$ of intended electromagnetic noise.

(7) In further another preferable example of the electromagnetic shield structure according to the first aspect of the present invention, the digital device can be connected to DC power sources each having different values through the first structure portion and the second structure portion of the second shield.

(8) In further another preferable example of the electromagnetic shield structure according to the first aspect of the present invention, the first shield, the second shield, and the dielectric material have a power source decoupling function that reduces electromagnetic noise from a power source of the digital device, in addition to an electromagnetic shield function that reduces electromagnetic noise from the digital device.

(9) In further another preferable example of the electromagnetic shield structure according to the first aspect of the present invention, the second shield has an integral structure without the gap between the first structure portion and the second structure portion, the first shield and the second shield are arranged in such a way that the side panel of the first shield and the side panel of the second shield are perpendicular to each other, and the dielectric material is provided between the first shield and the second shield. In this example, because a capacitor is formed by the first shield, the second shield, and dielectric material, the power source decoupling function of the digital device is achieved in addition to the electromagnetic shield function.

(10) A second exemplary aspect of the present invention is a wireless apparatus that includes a wireless device and a digital device implemented on a substrate, including: an electromagnetic shield structure having a first shield and a second shield that are arranged on the substrate so as to cover the digital device, wherein the first shield is formed of a conductor electrically connected to a ground terminal of the substrate and is arranged on an outermost side of the electromagnetic shield structure, the second shield has a first structure portion being conductive and a second structure portion being conductive, each of the first structure portion and the second structure portion being separately formed and electrically connected to power source terminals of the substrate, the first structure portion and the second structure portion are arranged in such a way that open faces each formed at one end of the first structure portion and the second structure portion are opposed to each other with a predetermined gap, and the digital device is interposed between the first structure portion and the second structure portion and is covered by the first structure portion and the second structure portion.

In the wireless apparatus according to the second exemplary aspect of the present invention, because the digital device that is the radiation source of the electromagnetic noise is covered by the electromagnetic shield structure including the first shield and the second shield, as mentioned above, the electromagnetic noise radiated from the digital device can be shielded. Therefore, it is possible to reduce the contamination of the electromagnetic noise that flows into the wireless device.

Further, in the electromagnetic shield structure, even if the first structure portion and the second structure portion of the second shield are excited by the digital device, the open faces each formed at one end of the first structure portion and the second structure portion are opposed to each other and electromagnetic fields radiated from the open faces cancel each other out. As a result, it is possible to reduce the radiation of the electromagnetic noise from the first structure portion and the second structure portion. Thus, it is possible to effectively reduce the contamination of the electromagnetic noise that is radiated from the digital device and flows into the wireless device.

(11) In a preferable example of the wireless apparatus according to the second aspect of the present invention, the first shield includes a top panel that covers the digital device and a pair of a first side panel and a second side panel respectively arranged at a first side and a second side of the top panel, the first side and the second side being opposed to each other, and the first side panel is arranged on a side near the wireless device and the second side panel is arranged on a side far from the wireless device.

(12) In another preferable example of the wireless apparatus according to the second aspect of the present invention, the first shield has a U-shaped cross section and is formed of a top panel having a size to cover the digital device, a first side panel that is arranged at one side of the top panel, and a second side panel that is arranged at another side that faces the one side of the top panel.

(13) In further another preferable example of the wireless apparatus according to the second aspect of the present invention, each of the first structure portion and the second structure portion of the second shield has an L-shaped cross section and is formed of a top panel that covers the digital device and a side panel that is bent and connected to one side of the top panel.

(14) In further another preferable example of the wireless apparatus according to the second aspect of the present invention, a dielectric material is provided between the top panel of the first shield and the top panel of the second shield. In this example, because a capacitor is formed by the first shield, the second shield, and dielectric material, the power source decoupling function of the digital device is achieved in addition to the electromagnetic shield function.

(15) In another preferable example of the wireless apparatus according to the second aspect of the present invention, the first shield and the second shield are arranged in such a way that the side panel of the first shield and the side panel of the second shield are perpendicular to each other or are parallel to each other.

(16) In further another preferable example of the wireless apparatus according to the second aspect of the present invention, the top panel of the first structure portion and the top panel of the second structure portion in the second shield are not equal in length to about a quarter ($\lambda/4$) of a wavelength $\lambda$ of intended electromagnetic noise.

(17) In further another preferable example of the wireless apparatus according to the second aspect of the present invention, the digital device can be connected to DC power sources each having different values through the first structure portion and the second structure portion of the second shield.

(18) In further another preferable example of the wireless apparatus according to the second aspect of the present invention, the first shield, the second shield, and the dielectric material have a power source decoupling function that reduces electromagnetic noise from a power source of the digital device, in addition to an electromagnetic shield function that reduces electromagnetic noise from the digital device.

(19) In further another preferable example of the wireless apparatus according to the second aspect of the present invention, the second shield has an integral structure without the gap between the first structure portion and the second structure portion, the first shield and the second shield are arranged in such a way that the side panel of the first shield and the side panel of the second shield are perpendicular to each other, and the dielectric material is provided between the first shield and the second shield. In this example, because a capacitor is formed by the first shield, the second shield, and the dielectric material, the power source decoupling function of the digital device is achieved in addition to the electromagnetic shield function.

(20) A third exemplary aspect of the present invention is a wireless apparatus that includes a wireless device and a digital device implemented on a substrate, including: an electromagnetic shield having a U-shaped cross section and arranged so as to cover the digital device, wherein the electromagnetic shield includes a top panel having a size to cover the digital device, a pair of a first side panel and a second side panel respectively arranged at a first side and a second side of the top panel, the first side and the second side being opposed to each other, and the first side panel is arranged on a side near the wireless device and the second side panel is arranged on a side far from the wireless device.

In the wireless apparatus according to the third exemplary aspect of the present invention, because the digital device that is the radiation source of the electromagnetic noise is covered by the electromagnetic shield and the first side panel is arranged at an appropriate position for the electromagnetic shield effect, as mentioned above, the electromagnetic noise radiated from the digital device can be shielded. Therefore, it is possible to reduce the contamination of the electromagnetic noise that flows into the wireless device with a simple configuration.

(21) Further, a method of manufacturing an electromagnetic shield having a first shield and a second shield and arranged on a substrate so as to cover a digital device implemented on the substrate, the method including: forming the first shield by electrically connecting a conductor that forms the first shield to a ground terminal of the substrate and by arranging the first shield at an outermost side; forming the second shield by electrically connecting a first structure portion being conductive and a second structure portion being conductive which form the second shield and which are separately formed, to power source terminals of the substrate and by arranging the first structure portion and the second structure portion in such a way that open faces are opposed to each other with a predetermined gap at one end of the first structure portion and the second structure portion and the digital device is interposed between the first structure portion and the second structure portion and is covered by the first structure portion and the second structure portion.

Advantageous Effects

The electromagnetic shield structure according to the first exemplary aspect of the present invention and the wireless apparatus according to the second exemplary aspect of the present invention have an advantageous effect that it is possible to reduce the contamination of the electromagnetic noise that is radiated from the digital device and flows into the wireless device. Further, when the dielectric material is provided between the first shield and the second shield, there is such an advantageous effect that the power source decoupling function of the digital device is achieved in addition to the electromagnetic shield function.

The wireless apparatus according to the third exemplary aspect of the present invention has an advantageous effect that it is possible to reduce the contamination of the electromagnetic noise that is radiated from the digital device and flows into the wireless device with a simple configuration.

EXPLANATION OF REFERENCE 1, 21, 31, 41 ELECTROMAGNETIC SHIELD STRUCTURE
2 ANTENNA (WIRELESS DEVICE)
3 FIRST SHIELD
3a TOP PANEL
3b FIRST SIDE PANEL
3c SECOND SIDE PANEL
4 SECOND SHIELD
4a FIRST L-SHAPED STRUCTURE PORTION (FIRST STRUCTURE PORTION)
4b SECOND L-SHAPED STRUCTURE PORTION (SECOND STRUCTURE PORTION)
4c, 4e TOP PANEL
4d FIRST L-SHAPED STRUCTURE PORTION SIDE PANEL
4f SECOND L-SHAPED STRUCTURE PORTION SIDE PANEL
5 DIELECTRIC MATERIAL
6a, 6b GROUND TERMINAL
7a, 7b POWER SOURCE TERMINAL
42 SHIELD
101 SUBSTRATE
102 LSI (DIGITAL DEVICE)

BEST MODE FOR CARRYING OUT THE INVENTION

Preferable embodiments of the present invention are described below with reference to the accompanying drawings.

First Exemplary Embodiment

Figure 1A:
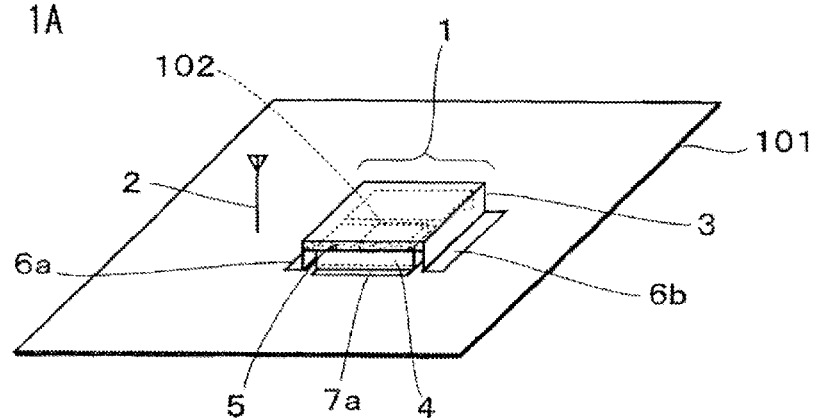
FIG. 1A is a perspective illustration showing an electromagnetic shield structure according to a first exemplary embodiment of the present invention.
Figure 1B:
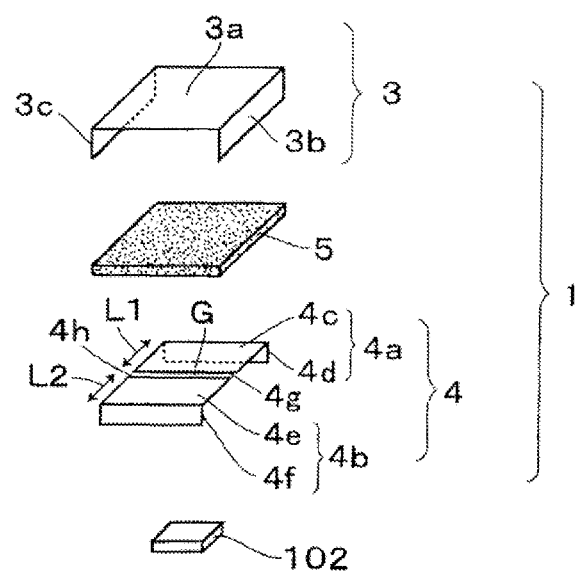
FIG. 1B is an exploded view of the electromagnetic shield structure according to the first exemplary embodiment of the present invention.
Figure 1B:
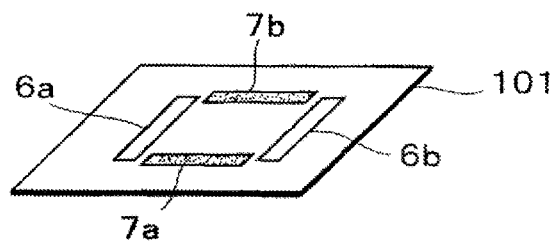
Figure 2:
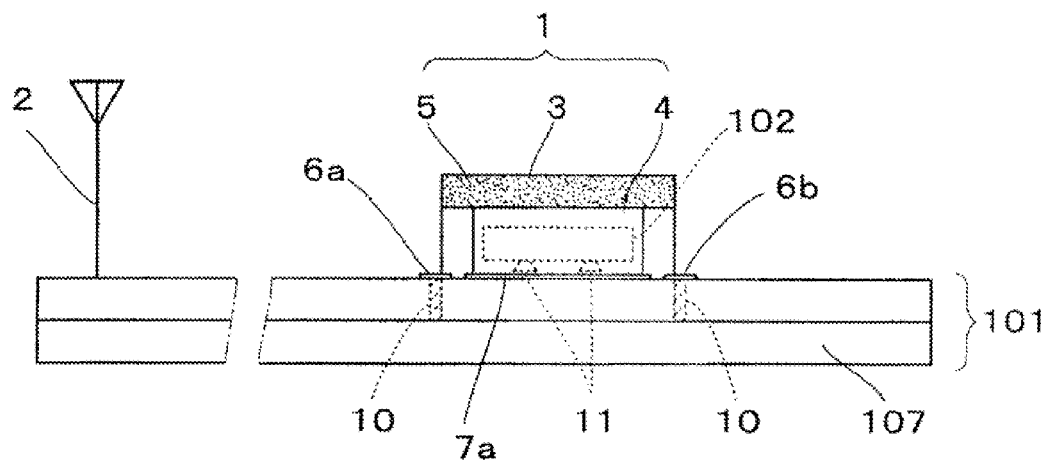
FIG. 2 is a side view of the electromagnetic shield structure according to the first exemplary embodiment of the present invention.

FIGS. 1 and 2 show an electromagnetic shield structure 1 according to a first exemplary embodiment of the present invention. FIG. 1A is a perspective illustration thereof, FIG. 1B is an exploded perspective view thereof, and FIG. 2 is a side view thereof.

Figure 6A:
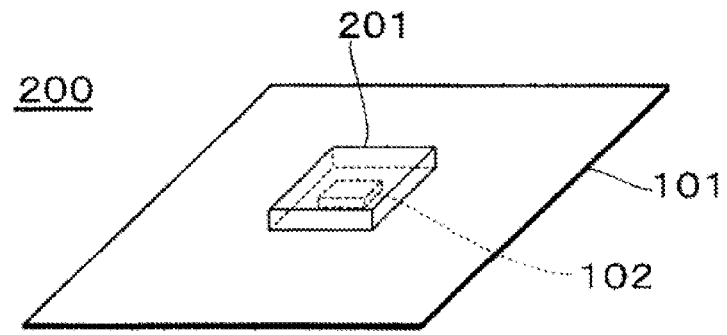
FIG. 6A is a perspective illustration showing a metal shield structure according to a background art.
Figure 6B:
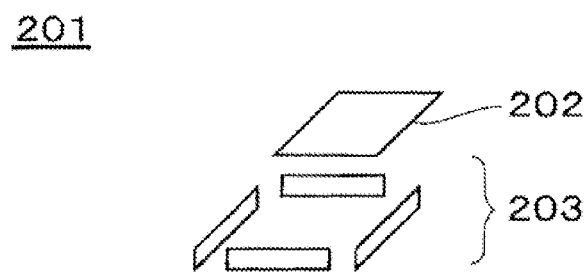
FIG. 6B is an exploded view of the metal shield structure according to the background art.
Figure 6C:
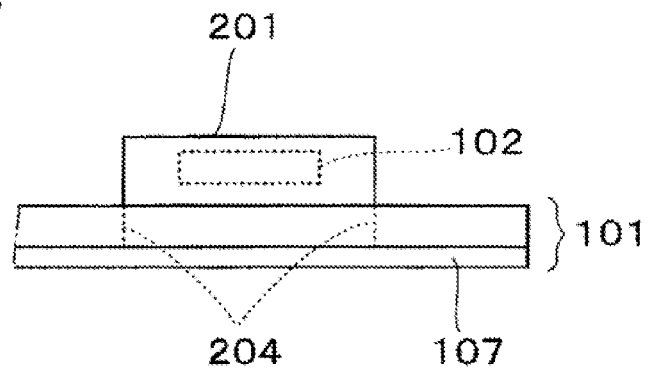
FIG. 6C is a side view of the metal shield structure according to the background art.
Figure 7:
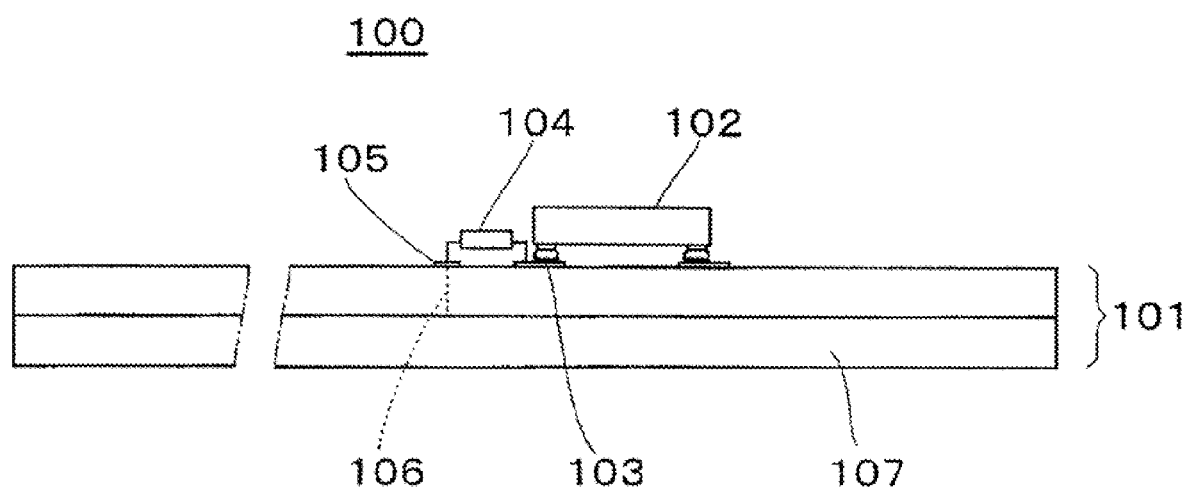
FIG. 7 is a side view of a structure using a power source decoupling technique.

This exemplary embodiment is explained with the same symbols denoting the same parts as the components shown in FIGS. 6 and 7, which have been described in the Background Art section. Further, the overall configuration of a wireless device is omitted and only the vicinity of the electromagnetic shield structure 1 is explained.

The electromagnetic shield structure 1 according to the first exemplary embodiment is mounted in a commonly known wireless device (e.g., a wireless communication device such as a mobile phone) and has an electromagnetic shield function that prevents electromagnetic noise radiated from a digital device LSI 102 and electromagnetic noise conducted from a power source system of the LSI 102 from flowing into an antenna 2 that is a wireless device, and a power source decoupling function of the LSI 102.

As shown in FIG. 1A and FIG. 2, the electromagnetic shield structure 1, which is used in the wireless device, includes a first shield 3 that is electrically connected (grounded) to a ground layer 107 in a substrate 101 having a multilayer structure through ground terminals 6a and 6b on the substrate 101, a second shield 4 that is electrically connected to power source terminals 7a and 7b on the substrate 101, and a dielectric material 5 that is provided between the first shield 3 and the second shield 4. Further, as shown in FIG. 1B, the LSI 102 which is implemented on the substrate 101 and which is the radiation source of the electromagnetic noise is covered by the second shield 4, the dielectric material 5, and the first shield 3 in this order from the nearest side of the LSI 102.

The first shield 3 has a U-shaped cross section and is arranged so as to cover the LSI 102. The first shield 3 is formed by bending a metal plate into a U-shaped cross section and is configured by a rectangular top panel 3a, a rectangular first side panel 3b that is connected to one side of the top panel 3a, and a rectangular second side panel 3c that is integrally connected to another side of the top panel 3a that faces the first side panel 3b (i.e., opposite side of the first side panel 3b) of the top panel 3a. The first side panel 3b and the second side panel 3c are connected to the top panel 3a at an angle of about 90 degrees and are opposed to each other. The top panel 3a is arranged substantially parallel to the substrate 101. The first side panel 3b and the second side panel 3c are disposed substantially at a right angle to the substrate 101. The pair of the first side panel 3b and the second side panel 3c has the same shape and the same size and is electrically connected (grounded) to the ground terminals 6a and 6b on the substrate 101 at the bottom thereof by solder or the like. Thus, the first shield 3 is fixed onto the substrate 101.

The second shield 4 is configured by a combination of a first L-shaped structure portion 4a and a second L-shaped structure portion 4b that are formed with an L-shaped cross section. The first L-shaped structure portion 4a and the second L-shaped structure portion 4b are formed of metal plates that are bent into an L-shaped cross section. The first L-shaped structure portion 4a is formed of a rectangular top panel 4c and a rectangular side panel 4d (hereinafter, it is also referred to as a first L-shaped structure portion side panel) that is connected to one side of the top panel 4c at an angle of about 90 degrees with respect to the top panel 4c. The second L-shaped structure portion 4b has the same size and the same shape as the first L-shaped structure portion 4a and is formed of a rectangular top panel 4e and a rectangular side panel 4f (hereinafter, it is also referred to as a second L-shaped structure portion side panel) that is connected to one side of the top panel 4e at an angle of about 90 degrees with respect to the top panel 4e. The top panels 4c and 4e are arranged substantially parallel to the substrate 101. The side panels 4d and 4f are disposed substantially at a right angle to the substrate 101.

At the first L-shaped structure portion 4a and the second L-shaped structure portion 4b, an open face (notch portion) 4g that is formed at one end (opposite side of the side panel 4d) of the top panel 4c of the first L-shaped structure portion 4a and an open face (notch portion) 4h that is formed at one end (opposite side of the side panel 40 of the top panel 4e of the second L-shaped structure portion 4b are opposed to each other with a slight gap G. The open faces (notch portions) 4g and 4h are nearly parallel.

The second shield 4 sandwiches the LSI 102 with the side panel 4d of the first L-shaped structure portion 4a and the side panel 4f of the second L-shaped structure portion 4b and covers the LSI 102 by the top panel 4c of the first L-shaped structure portion 4a and the top panel 4e of the second L-shaped structure portion 4b.

The power source terminals 7a and 7b are formed outside two facing side surfaces of the LSI 102 on the surface of the substrate 101. The first L-shaped structure portion side panel 4d and the second L-shaped structure portion side panel 4f of the second shield 4 are electrically connected to the power source terminals 7a and 7b, respectively, by solder or the like. Thus, the second shield 4 is fixed onto the substrate 101.

The ground terminals 6a and 6b are formed outside other two facing side surfaces of the LSI 102 on the surface of the substrate 101. Therefore, the ground terminals 6a and 6b and the power source terminals 7a and 7b extend in mutually perpendicular directions.

The first L-shaped structure portion side panel 4d and the second L-shaped structure portion side panel 4f of the second shield 4 are perpendicular to the first side panel 3b and the second side panel 3c of the first shield 3.

The rectangular dielectric material 5 having substantially the same size as the top panel 3a of the first shield 3 is placed on the top panel 4c of the first L-shaped structure portion 4a and the top panel 4e of the second L-shaped structure portion 4b of the second shield 4. The top surface of the dielectric material 5 is in close contact with the top panel 3a of the first shield 3.

Illustration is omitted in FIGS. 1A and 1B, however, a plurality of vias (mentioned hereinafter) for connecting to the ground are arranged at the ground terminals 6a and 6b, to which the first shield 3 is connected, in a longitudinal direction thereof, and the first shield 3 is electrically grounded to the ground layer 107 that is formed in the inner layer of the substrate 101, through the vias.

Referring next to FIG. 2, the wireless device in which the above-mentioned electromagnetic shield structure 1 is mounted according to the first exemplary embodiment of the present invention is described.

In this wireless device, the LSI 102 that is the radiation source of the electromagnetic noise and the antenna 2 into which the electromagnetic noise flows are mounted on the same substrate 101. The first shield 3 and the second shield 4 that configure the electromagnetic shield structure 1, as mentioned below in detail, have a power source decoupling operation (a power source decoupling function) in addition to the operation that reduces the radiation of the electromagnetic noise (the electromagnetic noise reducing function).

The first shield 3, as shown in FIG. 2, is larger than the LSI 102 and implemented on the substrate 101 with the LSI 102. The substrate 101 is a multilayer substrate and includes the ground layer 107 with solid pattern in the inner layer and the rectangular ground terminals 6a and 6b for grounding on the surface layer. The ground terminals 6a and 6b are electrically connected (grounded) to the ground layer 107 through via holes 10 at the inner layer.

The ground terminals 6a and 6b are selected so as to have nearly the same length as that of the first side panel 3b and the second side panel 3b of the first shield 3. Further, the plurality of via holes 10 are aligned along the longitudinal direction at a narrow pitch in the substrate 101 and form via hole lines (not shown). These are formed to ensure the grounding of the ground terminals 6a and 6b and the ground layer 107.

Each via hole line equivalently behaves as a metal wall because the arrangement pitch of the via holes 10 in this case is narrow enough compared with a wavelength λ of the intended electromagnetic noise. Therefore, because both the top surface and the under surface and both the left surface and the right surface of the LSI 102 are shielded by the metal plate when the first shield 3 is electrically connected to the ground terminals 6a and 6b, the shield structure having the first shield 3, the via hole lines, and the ground layer 107 is formed. As a result, it is possible to effectively reduce the electromagnetic noise from the LSI 102.

On the other hand, the second shield 4 is connected to the power source system of the substrate 101. In this case, the second shield 4 is electrically connected to the power source terminals 7a and 7b that supply a predetermined potential to power source terminals 11 of the LSI. The first shield 3 that is slightly wider covers the second shield 4. The first side panel 3b and the second side panel 3c of the first shield 3 are perpendicular to the first L-shaped structure portion side panel 4d and the second L-shaped structure portion side panel 4f of the second shield 4.

The dielectric material 5 that is as large as the top panel 3a of the first shield 3 is provided between the first shield 3 and the second shield 4. In this case, the top panel 3a of the first shield 3 and the top panels 4c and 4e of the second shield 4 behave as electrode plates, and the insulation properties of the first shield 3 and the second shield 4 are maintained by the dielectric material 5 provided between both the electrode plates. Thus, the first shield 3 and the second shield 4 form a capacitor and have the power source decoupling function.

The power source terminals 7a and 7b are equivalent to being grounded to the ground layer 107 by the second shield 4 at the high frequency because the impedance of the capacitor generally decreases in a high-frequency band. Therefore, even though the second shield 4 is connected to the power source system, the second shield 4 behaves as the electromagnetic shield against the electromagnetic noise radiated from the LSI 102.

The second shield 4, as shown in FIG. 1B, is configured by the combination of the first L-shaped structure portion 4a and the second L-shaped structure portion 4b. The top panel 4c of the first L-shaped structure portion 4a and the top panel 4e of the second L-shaped structure portion 4b are arranged to cover the LSI 102, and the gap G between the top panels 4c and 4e is extremely narrow compared with the wavelength λ. Therefore, the high-frequency electromagnetic noise radiated from the LSI 102 can be shielded not only by the first shield 3 but also by the first L-shaped structure portion 4a and the second L-shaped structure portion 4b that are arranged at the left and right sides of the LSI 102.

Further, the second shield 4 has a configuration in which the separated first L-shaped structure portion 4a and second L-shaped structure portion 4b are non-conductive with the slight gap G formed therebetween. Therefore, because the first L-shaped structure portion 4a and the second L-shaped structure portion 4b that are connected to the power source are galvanically separated, the second shield 4 can supply DC voltages that supply the power source to the LSI 102 as dual source voltages that have different values, for example.

Therefore, in this electromagnetic shield structure 1, even if the LSI 102 is an LSI group having a dual power source system, it is possible to supply the first L-shaped structure portion 4a and the second L-shaped structure portion 4b with different voltages and achieve the power source decoupling.

By the way, the LSI 102 that is the radiation source of the electromagnetic noise is arranged inside thereof. Therefore, when each of lengths L1 and L2 of the top panel becomes equal to a resonant length (whole-number multiple of λ/4) that is about a quarter of the wavelength λ of the radiated electromagnetic noise, the first L-shaped structure portion 4a and the second L-shaped structure portion 4b resonate and behave like a patch antenna and may radiate electromagnetic fields from the open face 4g of the top panel 4c and the open face 4h of the top panel 4e.

However, the second shield 4 according to the present invention is configured such that the first L-shaped structure portion 4a and the second L-shaped structure portion 4b are opposed to each other so as to sandwich the LSI 102 and the open face 4g formed at the leading end of the top plate 4c of the first L-shaped structure portion 4a and the open face 4h formed at the leading end of the top plate 4e of the second L-shaped structure portion 4b are opposed to each other. By this configuration, the electromagnetic fields radiated from the open faces 4g and 4h cancel each other out even if the first L-shaped structure portion 4a and the second L-shaped structure portion 4b are excited. As a result, it is possible to reduce the radiation of the electromagnetic noise from the first L-shaped structure portion 4a and the second L-shaped structure portion 4b.

Further, in the electromagnetic shield structure 1 according to the first exemplary embodiment, the first shield 3 is also configured by considering the positional relationship with the antenna 2. Therefore, a greater shield effect is produced. That is, as shown in FIG. 1A, FIG. 1B, and FIG. 2, because the first shield 3 is arranged on the side nearer to the antenna 2 than the second shield 4, the first shield 3 has such characteristics as mentioned below.

At first, as shown in FIG. 1A, the second side panel 3c is arranged along one side on the side where the antenna 2 is positioned and the first side panel 3b is arranged along another side on the opposite side, among four sides of the top panel 3a of the first shield 3. To verify the effectiveness of such arrangement of the first side panel 3b and the second side panel 3c of the first shield 3, the inventor measured the amount of contamination of the noise radiated from the LSI 102 to the antenna 2 by using electromagnetic field analysis.

In this verification test, the substrate 101 has a size of 140 mm square (x=140 mm, y=140 mm), and the LSI 102 is arranged substantially the center of the substrate 101, and the antenna 2 is arranged near the edge (the location at x=70 mm, y=10 mm) of the substrate 101.

Next, the configuration of the first shield 3 was focused on as a model of the verification test, and a model A and a model B were studied.

The model A has the configuration of the first shield 3 as shown in FIG. 1A, a pair of the first side panel 3b and the second side panel 3c is arranged at one side (the nearest side to the antenna 2) on the side where the antenna 2 is positioned and at another side (the farthest side to the antenna 2) on the opposite side, among the four sides of the top panel 3a. On the other hand, in the model B, opening faces without the first side panel 3b and the second side panel 3c are arranged at one side (the nearest side to the antenna 2) on the side where the antenna 2 is positioned and at another side (the farthest side to the antenna 2) on the opposite side, and a pair of the first side panel 3b and the second side panel 3c is arranged at other two sides.

The technique disclosed in Japanese Patent No. 3885830 (Japanese Patent Application No. 2006-162491) was referred to as a noise source model of the LSI 102 and a loop model was used. A monopole antenna was used as the antenna 2. The loop model of the LSI 102 was excited at the frequency of 1 GHz and a noise current that flows into the antenna 2 was calculated as the amount of the noise.

As a result, it was confirmed that the noise flowing into the antenna 2 greatly decreased by about 40 dB compared with the model B, by covering the LSI 102 with the first shield 3 as in the model A.

Further, as a result of the study on the model B, it turned out that the amount of the noise decreased by about 8 dB and that the shield effect that reduces the amount of the noise was much greater in the model A. Note that 20 dB of the shield effect mentioned here corresponds to 1/10 of the current. Therefore, considering the 20 dB as a standard, it was confirmed that the model A in which the pair of the first side panel 3b and the second side panel 3c was arranged at a pair of sides including the side on the side where the antenna 2 is positioned can achieve much greater shield effect and thus is an efficient configuration.

Thus, there is an optimum arrangement of the first side panel 3b and the second side panel 3c of the first shield 3 depending on the positional relationship with the antenna 2. That is, in the wireless device according to the first exemplary embodiment, it turned out that it is not always possible to achieved the desired shield effect merely by arranging the first side panel 3b and the second side panel 3c, and that it is important to consider the location of the first side panel 3b and the second side panel 3c with respect to the antenna 2 in order to reduce the amount of the noise that is radiated from the LSI 102 and flows into the antenna 2.

The electromagnetic shield structure 1 according to the present invention can achieve the effective shield configuration according to the location of the antenna 2 and achieve the double shield configuration having the first shield 3 and the second shield 4. Further, in addition to such shield functions, it can achieve the power source decoupling function of the LSI 102 by configuring the capacitor with the dielectric material 5. Therefore, the electromagnetic shield structure 1 can effectively reduce the noise radiated from the LSI 102 and reduce the noise that flows into the antenna 2. Specifically, the effects are fully achieved in the wireless device having the antenna 2 mounted thereon.

As mentioned above, the electromagnetic shield structure 1 according to the first exemplary embodiment includes the first shield 3 and the second shield 4 that are arranged so as to cover the LSI 102 that is implemented on the substrate 101. The first shield 3 is formed of a conductor electrically connected to the ground terminals 6a and 6b of the substrate 101 and is arranged on the outermost side of the electromagnetic shield structure 1. The second shield 4 has the first L-shaped structure portion 4a being conductive and the second L-shaped structure portion 4b being conductive, and the first L-shaped structure portion 4a and the second L-shaped structure portion 4b are separately formed and electrically connected to the power source terminals 7a and 7b, respectively, of the substrate 101. Further, the first L-shaped structure portion 4a and the second L-shaped structure portion 4b are arranged such that the open faces 4g and 4h each formed at one end of the first L-shaped structure portion 4a and the second L-shaped structure portion 4b are opposed to each other with the predetermined gap G, and the LSI 102 is interposed between the first L-shaped structure portion 4a and the second L-shaped structure portion 4b and is covered by the first L-shaped structure portion 4a and the second L-shaped structure portion 4b.

Therefore, the electromagnetic shield structure 1 has the shield function that can reduce the influence of the electromagnetic noise radiated from the LSI 102, by the first shield 3 and the second shield 4. Further, even if the first L-shaped structure portion 4a and the second L-shaped structure portion 4b are excited by the LSI 102, the open face 4g of the first L-shaped structure portion 4a and the open face 4h of the second L-shaped structure portion 4b are opposed to each other, and thus the electromagnetic fields radiated from the open faces 4g and 4h cancel each other out. As a result, it is possible to reduce the radiation of the electromagnetic noise from the first L-shaped structure portion 4a and the second L-shaped structure portion 4b.

Further, because the electromagnetic shield structure 1 covers the LSI 102, which is the radiation source of the electromagnetic noise, by the double shield structure including the first shield 3 and the second shield 4 and is configured such that the second side panel 3c of the first shield 3 near the antenna 2 is arranged at an optimum position for obtaining a greater shield effect, it is possible to obtain the effect of shielding the noise that is radiated from the LSI 102 and the effect of reducing the noise that flows into the antenna 2.

Further, because the electromagnetic shield structure 1 includes the dielectric material 5 formed between the first shield 3 and the second shield 4, the first shield 3 and the second shield 4 that sandwich the dielectric material 5 form the capacitor. Therefore, the power source decoupling function of the LSI 102 is achieved in addition to the shield function that reduces the influence of the noise that is radiated from the LSI 102. That is, because the first shield 3 and the second shield 4 that are formed across the dielectric material 5 behave like a pair of the electrode plates and act as the capacitor, the capacitor is inserted between the power source terminals 7a and 7b and the ground terminals 6a and 6b of the LSI 102. This is effective in achieving the decoupling of the noise from the power source system.

Consequently, the electromagnetic shield structure 1 is effective in reducing the noise that is radiated from the digital device such as LSI 102 and reducing the noise that flows into the antenna 2 by the shield effect and decoupling effect, and the effects are fully achieved in the LSI 102 of the digital device, a functional module, and the wireless device in which the antenna 2 or the like of the wireless device is mounted.

Second Exemplary Embodiment

A variation of the shield structure according to the present invention is described hereinafter.

In the first exemplary embodiment mentioned above, the first L-shaped structure portion side panel 4d and the second L-shaped structure portion side panel 4f of the second shield 4 are arranged perpendicular to the first side panel 3b and the second side panel 3c of the first shield 3. However, as shown in FIG. 3, the first L-shaped structure portion side panel 4d and the second L-shaped structure portion side panel 4f of the second shield 4 may be arranged parallel to the first side panel 3b and the second side panel 3c of the first shield 3.

Figure 3A:
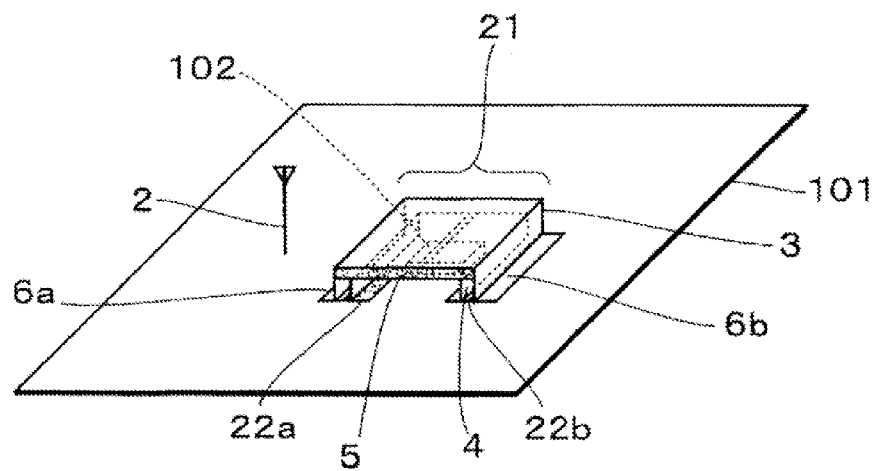
FIG. 3A is a perspective illustration showing an electromagnetic shield structure according to a second exemplary embodiment of the present invention.
Figure 3B:
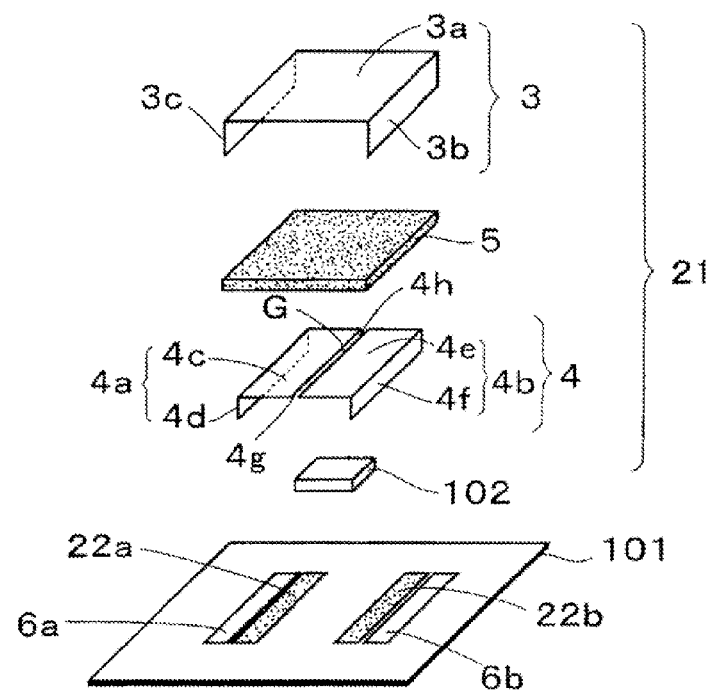
FIG. 3B is an exploded view of the electromagnetic shield structure according to the second exemplary embodiment of the present invention.
Figure 3C:
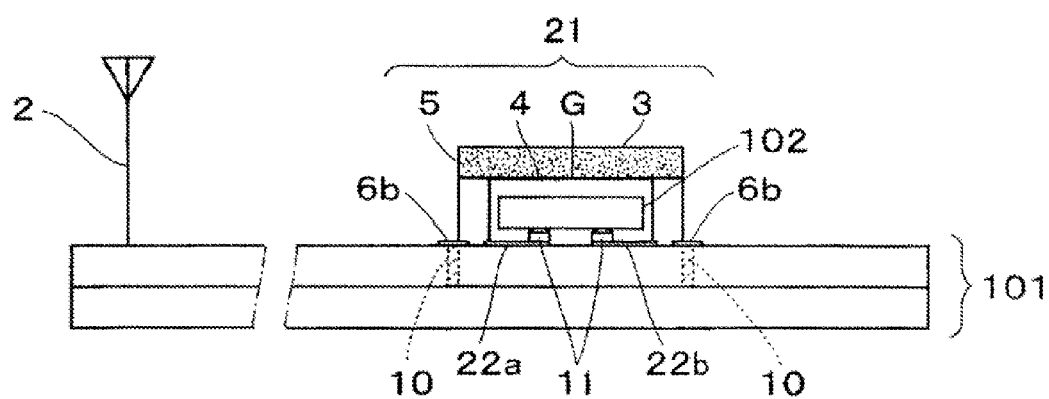
FIG. 3C is a side view of the electromagnetic shield structure according to the second exemplary embodiment of the present invention.

FIG. 3 show an electromagnetic shield structure 21 according to a second exemplary embodiment of the present invention. FIG. 3A is a perspective illustration thereof, FIG. 3B is an exploded perspective view thereof, and FIG. 3C is a side view thereof. This exemplary embodiment is explained with the same symbols denoting the same parts as the components of FIGS. 1 and 2 which have been explained in the first exemplary embodiment.

In the electromagnetic shield structure 21 according to the present invention, the first L-shaped structure portion side panel 4d and the second L-shaped structure portion side panel 4f of the second shield 4 are arranged parallel to the first side panel 3b and the second side panel 3c of the first shield 3. Further, power source terminals 22a and 22b on the substrate 101 are arranged at the positions corresponding to the first L-shaped structure portion side panel 4d and the second L-shaped structure portion side panel 4f of the second shield 4. The electromagnetic shield structure 21 according to this exemplary embodiment differs from that of the first exemplary embodiment mentioned above in the two points: the positions of the power source terminals 22a and 22b and the arrangement of the second shield 4. Other configurations and implementation structure are the same as those of the first exemplary embodiment mentioned above That is, the double shield structure is configured by covering the second shield 4 with the first shield 3, and the capacitor for decoupling is formed by inserting the dielectric material 5 between the first shield 3 and the second shield 4. Further, the first side panel 3b and the second side panel 3c of the first shield 3 are arranged at one side where the antenna 2 is arranged and at another side that faces the one side, respectively.

Therefore, as with the first exemplary embodiment, the electromagnetic shield structure 21 according to the second exemplary embodiment can also achieve the shield function and the decoupling function, and the effects are fully achieved to reduce the noise that is radiated from the LSI 102 mounted in the wireless device and to reduce the noise that flows into the antenna 2.

Third Exemplary Embodiment

As another exemplary embodiment, the second shield 4 may be integrally formed, instead of being formed with the two-divided structure.

FIG. 4 show an electromagnetic shield structure 31 according to a third exemplary embodiment of the present invention. FIG. 4A is a perspective illustration thereof and FIG. 4B is an exploded perspective view thereof. This exemplary embodiment is explained with the same symbols denoting the same parts as the components of FIGS. 1 and 2 that have been explained in the first exemplary embodiment.

Figure 4A:
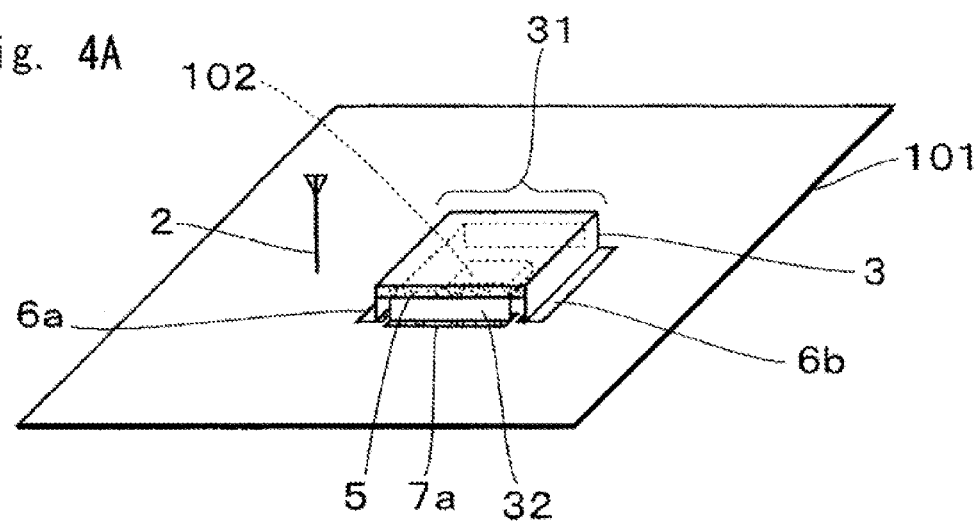
FIG. 4A is a perspective illustration showing an electromagnetic shield structure according to a third exemplary embodiment of the present invention.
Figure 4B:
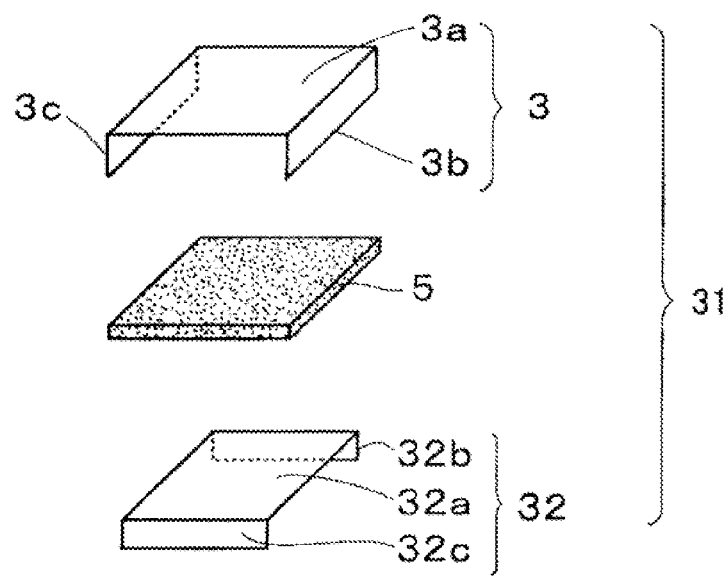
FIG. 4B is an exploded view of the electromagnetic shield structure according to the third exemplary embodiment of the present invention.
Figure 4B:
Figure 4B:
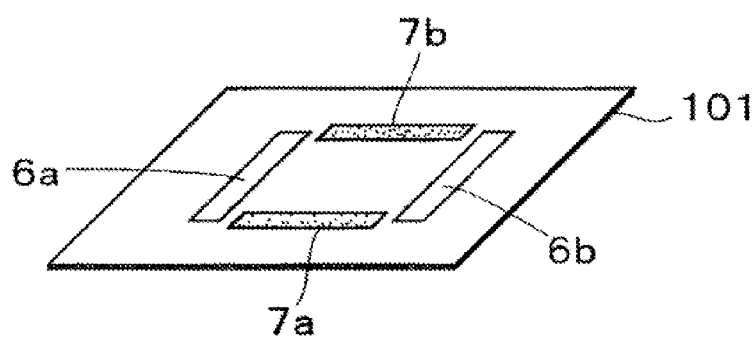

In the electromagnetic shield structure 31 according to the third exemplary embodiment, a second shield 32 is integrally formed. As shown in FIGS. 4A and 4B, the electromagnetic shield structure 31 includes the second shield 32 which is formed with a U-shaped cross section, and is integrally formed without the gap G (refer to FIG. 1B) as mentioned in the first exemplary embodiment. In this exemplary embodiment, a pair of the first L-shaped structure portion side panel 32d and the second L-shaped structure portion side panel 32c that are arranged at two facing sides of the rectangular top panel 32a of the second shield 32 is arranged perpendicular to the first side panel 3b and the second side panel 3c of the first shield 3. Further, as with the first exemplary embodiment mentioned above, the dielectric material 5 is proposed between the first shield 3 and the second shield 32, and the shield function and the decoupling function are achieved.

Therefore, the electromagnetic shield structure 31 can effectively reduce the noise radiated from the LSI 102 and reduce the noise that flows into the antenna 2.

Fourth Exemplary Embodiment

Further, the electromagnetic shield structure according to the present invention may reduce the electromagnetic noise that is radiated from the LSI and the noise that flows into the antenna of the wireless device by using only the electromagnetic shield function.

Figure 5A:
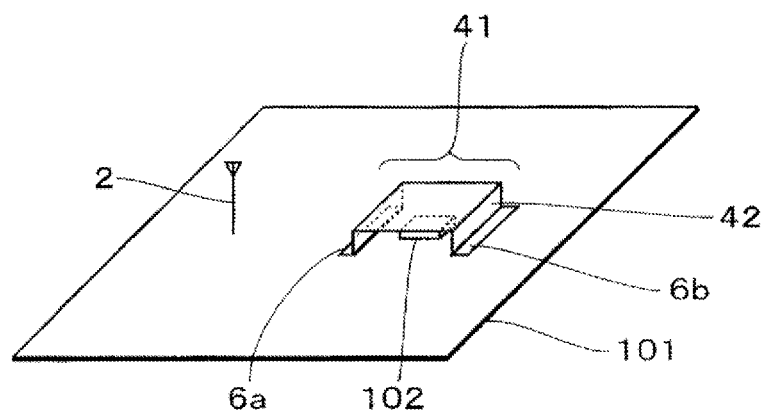
FIG. 5A is a perspective illustration showing an electromagnetic shield structure according to a fourth exemplary embodiment of the present invention.
Figure 5B:
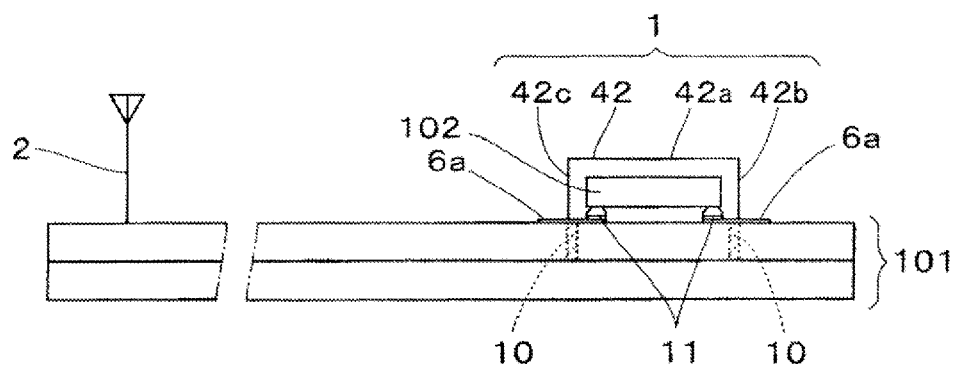
FIG. 5B is an exploded view of the electromagnetic shield structure according to the fourth exemplary embodiment of the present invention.

FIG. 5 show an example of an electromagnetic shield structure 41 according to a fourth exemplary embodiment that uses only the electromagnetic shield function. FIG. 5A is a perspective illustration thereof and FIG. 5B is a side view thereof. This exemplary embodiment is explained with the same symbols denoting the same parts as the components of FIGS. 1 and 2 that have been explained in the first exemplary embodiment.

The electromagnetic shield structure 41 omits the second shield 4 (refer to FIG. 1B) as mentioned in the first exemplary embodiment and is configured only by a shield 42 that is grounded to the ground layer 107, thereby simplifying the parts.

At a rectangular top panel 42a of the shield 42, a rectangular first side panel 42d is integrally formed at one side on the side where the antenna is positioned and a rectangular second side panel 42c is integrally formed at another side that faces the one side. Therefore, the shield 42 can achieve the reduction of the noise that flows into the antenna 2 by the first side panel 42d and the second side panel 42c.

Thus, the single shield structure shown in FIGS. 5A and 5B can also achieve the reduction of the noise that flows into the antenna 2 by optimizing the shield 42 in addition to the reduction of the noise radiated from the LSI 102 by the shield 42, and can produce an effect as the shield structure of the wireless device.

Other Exemplary Embodiments

The first to fourth exemplary embodiments mentioned above show preferable examples of the present invention. Therefore, the invention is not limited to those exemplary embodiments. For example, the electromagnetic shield structure may be applied to a general noise radiation source such as a module besides an LSI, and it goes without saying that various modifications can be made.

INDUSTRIAL APPLICABILITY

This invention can widely be applied as an electromagnetic shield of a high-frequency device that radiates electromagnetic noise.

The invention claimed is:

1. An electromagnetic shield structure comprising:
a first shield and a second shield that are arranged on a substrate so as to cover a digital device that is implemented on the substrate, wherein
the first shield is formed of a conductor electrically connected to a ground terminal of the substrate and is arranged on an outermost side of the electromagnetic shield structure,
the second shield has a first structure portion being conductive and a second structure portion being conductive, each of the first structure portion and the second structure portion being separately formed and electrically connected to power source terminals of the substrate,
the first structure portion and the second structure portion are arranged in such a way that open faces each formed at one end of the first structure portion and the second structure portion are opposed to each other with a predetermined gap, and
the digital device is interposed between the first structure portion and the second structure portion and is covered by the first structure portion and the second structure portion.

2. The electromagnetic shield structure according to claim 1, wherein the first shield has a U-shaped cross section and is formed of a top panel having a size to cover the digital device, a first side panel that is arranged at one side of the top panel, and a second side panel that is arranged at another side that faces with the one side of the top panel.

3. The electromagnetic shield structure according to claim 1, wherein each of the first structure portion and the second structure portion of the second shield has an L-shaped cross section and is formed of a top panel that covers the digital device and a side panel that is bent and connected to one side of the top panel.

4. The electromagnetic shield structure according to claim 1, wherein a dielectric material is provided between the top panel of the first shield and the top panel of the second shield.

5. The electromagnetic shield structure according to claim 1, wherein the first shield and the second shield are arranged in such a way that the side panel of the first shield and the side panel of the second shield are perpendicular to each other or are parallel to each other.

6. The electromagnetic shield structure according to claim 1, wherein the top panel of the first structure portion and the top panel of the second structure portion in the second shield are not equal in length to about a quarter ($\lambda/4$) of a wavelength $\lambda$ of intended electromagnetic noise.

7. The electromagnetic shield structure according to claim 1, wherein the digital device can be connected to DC power sources each having different values through the first structure portion and the second structure portion of the second shield.

8. The electromagnetic shield structure according to claim 4, wherein the first shield, the second shield, and the dielectric material have a power source decoupling function that reduces electromagnetic noise from a power source of the digital device, in addition to an electromagnetic shield function that reduces electromagnetic noise from the digital device.

9. The electromagnetic shield structure according to claim 1, wherein the second shield has an integral structure without the gap between the first structure portion and the second structure portion, the first shield and the second shield are arranged in such a way that the side panel of the first shield and the side panel of the second shield are perpendicular to each other, and the dielectric material is provided between the first shield and the second shield.

10. A wireless apparatus that includes a wireless device and a digital device implemented on a substrate, comprising:

an electromagnetic shield structure having a first shield and a second shield that are arranged on the substrate so as to cover the digital device, wherein the first shield is formed of a conductor electrically connected to a ground terminal of the substrate and is arranged on an outermost side of the electromagnetic shield structure, the second shield has a first structure portion being conductive and a second structure portion being conductive, each of the first structure portion and the second structure portion being separately formed and electrically connected to power source terminals of the substrate, the first structure portion and the second structure portion are arranged in such a way that open faces each formed at one end of the first structure portion and the second structure portion are opposed to each other with a predetermined gap, and the digital device is interposed between the first structure portion and the second structure portion and is covered by the first structure portion and the second structure portion.

11. The wireless apparatus according to claim 10, wherein the first shield includes a top panel that covers the digital device and a pair of a first side panel and a second side panel respectively arranged at a first side and a second side of the top panel, the first side and the second side being opposed to each other, and the first side panel is arranged on a side near the wireless device and the second side panel is arranged on a side far from the wireless device.

12. The wireless apparatus according to claim 10, wherein the first shield has a U-shaped cross section and is formed of a top panel having a size to cover the digital device, a first side panel that is arranged at one side of the top panel, and a second side panel that is arranged at another side that faces the one side of the top panel.

13. The wireless apparatus according to claim 10, wherein each of the first structure portion and the second structure portion of the second shield has an L-shaped cross section and is formed of a top panel that covers the digital device and a side panel that is bent and connected to one side of the top panel.

14. The wireless apparatus according to claim 10, wherein a dielectric material is provided between the top panel of the first shield and the top panel of the second shield.

15. The wireless apparatus according to claim 10, wherein the first shield and the second shield are arranged in such a way that the side panel of the first shield and the side panel of the second shield are perpendicular to each other or are parallel to each other.

16. The wireless apparatus according to claim 10, wherein the top panel of the first structure portion and the top panel of the second structure portion in the second shield are not equal in length to about a quarter ($\lambda/4$) of a wavelength $\lambda$ of intended electromagnetic noise.

17. The wireless apparatus according to claim 10, wherein the digital device can be connected to DC power sources each having different values through the first structure portion and the second structure portion of the second shield.

18. The wireless apparatus according to claim 14, wherein the first shield, the second shield, and the dielectric material have a power source decoupling function that reduces electromagnetic noise from a power source of the digital device, in addition to an electromagnetic shield function that reduces electromagnetic noise from the digital device.

19. The wireless apparatus according to claim 10, wherein the second shield has an integral structure without the gap between the first structure portion and the second structure portion, the first shield and the second shield are arranged in such a way that the side panel of the first shield and the side panel of the second shield are perpendicular to each other, and the dielectric material is provided between the first shield and the second shield.

20. A method of manufacturing an electromagnetic shield having a first shield and a second shield and arranged on a substrate so as to cover a digital device implemented on the substrate, the method comprising:

forming the first shield by electrically connecting a conductor that forms the first shield to a ground terminal of the substrate and by arranging the first shield at an outermost side;

forming the second shield by electrically connecting a first structure portion being conductive and a second structure portion being conductive which form the second shield and which are separately formed, to power source terminals of the substrate and by arranging the first structure portion and the second structure portion in such a way that open faces are opposed to each other with a predetermined gap at one end of the first structure portion and the second structure portion and the digital device is interposed between the first structure portion and the second structure portion and is covered by the first structure portion and the second structure portion.

* * * * *